United States Patent [19]

Subbanna

[11] Patent Number: 5,294,558
[45] Date of Patent: Mar. 15, 1994

[54] METHOD OF MAKING DOUBLE-SELF-ALIGNED BIPOLAR TRANSISTOR STRUCTURE

[75] Inventor: Seshadri Subbanna, Hopewell Junction, N.Y.

[73] Assignee: International Business Machines Corporation, Armonk, N.Y.

[21] Appl. No.: 69,337

[22] Filed: Jun. 1, 1993

[51] Int. Cl.$^5$ .................... H01L 21/265; H01L 29/70
[52] U.S. Cl. .......................... 437/31; 437/69; 148/DIG. 11; 257/518
[58] Field of Search .................... 437/31, 69; 148/DIG. 11; 357/518

[56] References Cited

U.S. PATENT DOCUMENTS

| | | | |
|---|---|---|---|
| 4,104,086 | 8/1978 | Bondur et al. | 148/1.5 |
| 4,139,442 | 2/1979 | Bondur et al. | 204/192 E |
| 4,160,991 | 7/1979 | Anantha et al. | 357/49 |
| 4,318,751 | 3/1982 | Horng | 148/1.5 |
| 4,319,932 | 3/1982 | Jambotkar | 148/1.5 |
| 4,960,726 | 10/1990 | Lechaton et al. | 437/31 |
| 4,994,400 | 2/1991 | Yamaguchi et al. | 437/31 |
| 4,994,881 | 2/1991 | Gomi | 257/518 |
| 4,996,581 | 2/1991 | Hamasaki | 437/31 |
| 5,024,957 | 6/1991 | Harame et al. | 437/31 |
| 5,039,624 | 8/1991 | Kadota | 437/31 |
| 5,100,813 | 3/1992 | Nihira | 437/31 |
| 5,118,634 | 6/1992 | Neudeck et al. | 437/31 |
| 5,134,082 | 7/1992 | Kirchgessner | 437/31 |
| 5,185,276 | 2/1993 | Chen et al. | 437/31 |
| 5,204,277 | 4/1993 | Somero et al. | 148/DIG. 10 |
| 5,234,846 | 8/1993 | Chu et al. | 437/33 |

FOREIGN PATENT DOCUMENTS

| | | | |
|---|---|---|---|
| 0082668 | 3/1989 | Japan | 437/311 |
| 0304931 | 12/1990 | Japan | 437/31 |
| 4309232 | 10/1992 | Japan | 437/31 |

OTHER PUBLICATIONS

Washio, K. et al. "Fabrication Process and Device Characteristics of Sidewall Base Contact Structure Transistor Using Two-Step Oxidation of Sidewall Surface", IEEE Transactions on Electron Devices, vol. 35, No. 10, p. 1596, Oct. 1988.

Yamamoto, Y. et al. "SDX: A Novel Self-Aligned Technique and Its Application to High-Speed Bipolar LSI's", IEEE Transactions on Electron Devices, vol. 35, No. 10, p. 1601, Oct. 1988.

Konaka, S. et al. "A 30-ps Si Bipolar IC Using Super Self-Aligned Process Technology", IEEE Transactions on Electron Devices, vol. ED-33, No. 4, p. 526, Apr. 1986.

Primary Examiner—Olik Chaudhuri
Assistant Examiner—Long Pham
Attorney, Agent, or Firm—Michael J. Balconi-Lamica

[57] ABSTRACT

A method of making an improved bipolar transistor and the transistor itself having a double-self-aligned device structure are disclosed. The method and the transistor device provide self-alignment of collector-base and base-emitter junctions to each other, in addition to self-alignment of the base and emitter.

2 Claims, 3 Drawing Sheets

METHOD OF MAKING DOUBLE-SELF-ALIGNED BIPOLAR TRANSISTOR STRUCTURE

BACKGROUND OF THE INVENTION

1. Field of the Invention

The invention relates to a self-aligned process for fabricating improved high performance bipolar transistors.

2. Discussion of the Related Art

Numerous integrated circuit devices, structures and techniques of fabricating the same, are known in the art.

The present trend in semiconductor technology is toward large scale integration of devices with very high speed and low power dissipation. To achieve this goal, it is essential that the devices be made as small as possible and that the parasitic capacitance be reduced to a small value. These high performance devices can be made by (a) making the vertical junction structure shallow, (b) reducing the horizontal geometry and (c) achieving complete dielectric isolation.

Shallow-junction device profile can be achieved with ion-implantation of dopant species. Ion-implantation technique permits precise control of the impurity dose and depth of penetration into the semiconductor. Unlike the conventional thermal diffusion process, ion-implantation is not a high temperature process. Thus, by using lithographic resist or metal maskings, multiple impurity introduction operations can be achieved without resort to high temperatures. Exposure to high temperature, as in the diffusion process, disperses the impurities previously introduced. For the implanted device, a designed thermal cycle is used to activate and diffuse the various dopant species to the desired junction depth and profile.

Device horizontal geometry depends to a large extent on the lithographic tools available. Within a given constraint, however, the use of a self-aligned process can greatly reduce the device horizontal dimension. By implementation of the dielectric isolation scheme such as Recessed Oxide Isolation (ROI) or Deep Dielectric Isolation (DDI) the successive fabrication steps can be done in a self-alignment fashion. In addition to reduction of device horizontal geometry, dielectric isolation also eliminates the sidewalls of the device doping regions and thus further reduces the device parasitic capacitances. A problem associated with the ROI is the formation of a "bird's beak" and "bird's head" structure at the lateral edges of the recessed oxide. The "bird's beak" structure prevents the device junction sidewalls to fully butt against the dielectric isolation and thus imposes the need for wider tolerance of device lateral dimension. Deep dielectric isolation DDI, however, avoids the above mentioned ROI problem. Unlike the "bird's beak" structure in ROI, sidewalls of the DDI structure are nearly vertical. Also, the surface of the DDI regions and the silicon where device regions ar to be formed is coplanar. Reference is made to U.S. Pat. No. 4,104,086 entitled "Method For Forming Isolated Regions of Silicon Utilizing Reactive Ion Etching" granted Aug. 1, 1978 to J. A. Bondur et al., and U.S. Pat. No. 4,139,442 entitled "Reactive Ion Etching Method For Producing Deep Dielectric Isolation in Silicon" granted Feb. 13, 1979 to J. A. Bondur et al., respectively of common assignee herewith.

For the very small bipolar transistor, as for example, submicron size transistor, the base area and hence the collector-base junction capacitance is the most significant performance parameter. The active base area in the bipolar transistor is the region below the emitter. The base region which surrounds the emitter is the inactive base. On conventional transistors, the metal to base contact is formed directly above the inactive base region. The transistor base area that is needed to accommodate the emitter and base contacts is considerably larger than the active base region.

To reduce the transistor base area, a process using polysilicon for making contact to the base is described in U.S. Pat. No. 4,160,991 entitled "High Performance Bipolar Device and Method for Making Same" granted Jul. 10, 1979 to N. G. Anantha et al. and of common assignee herewith. The Anantha et al patent discloses a method for manufacturing a high performance bipolar device and the resulting structure which has a very small emitter-base spacing. The small emitter-base spacing reduces the base resistance compared to earlier device spacing and thereby improves the performance of the bipolar device. The method involves providing a silicon semiconductor body having regions of monocrystalline silicon isolated from one another by isolation regions and a buried subsollector therein. A base region is formed in the isolated monocrystalline silicon. A mask is formed on the surface of the silicon body covering those regions designated to be the emitter and collector reach-through regions. A doped polycrystalline silicon layer is then formed through the mask covering the base region and making ohmic contact thereto. An insulating layer is formed over the polysilicon layer. The mask is then removed from those regions designated to be the emitter and collector reach-through regions. The emitter junction is then formed in the base region and the collector reach-through formed to contact the buried subcollector. Electrical contacts are made to the emitter and collector. The doped polycrystalline silicon layer is the electrical contact to the base region.

In Anantha et al., the heavily doped polysilicon is used to make contact to the transistor base. The metal to polysilicon contact is formed outside the base region and over the oxide isolation area. The emitter opening process described in Anantha et al., however, is not a self-aligned process. Therefore, transistor base area of the Anantha et al. device must be large enough to allow polysilicon to make low resistance contact to the base and also provide a sufficient leeway for the misregistration of the emitter contact to the doped region. Since the base area and hence the base-collector junction capacitance is a very important parameter in the performance of a very fast device, it is necessary to reduce this area to the minimum possible value.

In the article "A 30-ps Si Bipolar IC Using Super Self-Aligned Process Technology" by Konaka et al. (IEEE Transactions on Electronic Devices, Vol. ED-33, No. 4, April 1986, pages 526–531) a transistor fabrication process is described. In the fabrication of an n-p-n transistor according to Konaka et al., the emitter is self-aligned with respect to the base contact and the base contact is self-aligned with respect to the base, and therefore only one photomasking operation is required in order to form the transistor. In this method, a silicon nitride layer is formed over the region of the substrate in which the transistor is to be formed, and a layer of polysilicon is deposited over the silicon nitride layer. The polysilicon over the area corresponding to the emitter and base of the transistor is removed by a photomasking and etching operation, exposing the silicon nitride layer, and a surface layer of the polysilicon that remains is oxidized. The silicon nitride exposed by removal of polysilicon is removed by etching, and during the etching silicon nitride is removed from under the polysilicon, leaving a cavity. Polysilicon is depositied into the cavity providing a connection between the first deposit of polysilicon and the region that will be the base of the transistor. This method is subject to the disadvantage that it is difficult to control the side etching operation whereby the silicon nitride underneath the polysilicon is removed. Moreover, it is possible that voids will be formed when the polysilicon is deposited into the cavity formed by the side etching operation, so that reliability of connections between the first deposit of polysilicon and the base can not be ensured. In addition, while the fabrication process of Konaka et al. provides a self-aligned process using only one mask, it is further disadvantageous in high volume manufacturing of transistor devices. That is, the extra process steps, including the second polysilicon deposition step, increase manufacturing complexity and cost. In addition, the additional etching steps required by Konaka et al. introduce the increased possibility for defects in the resultant structure.

Another self-alignment technique for fabricating a bipolar transistor is disclosed in the article "Fabrication Process and Device Characteristics of Sidewall Base Contact Structure Transistor Using Two-Step Oxidation of Sidewall Surface" by Washio et al., IEEE Transactions on Electron Devices, Vol. 35, No. 10, October 1988, pages 1596-1600. The technique disclosed in Washio et al. includes two-step oxidation of a sidewall surface to achieve a desired $SiO_2$ sidewall thickness. Optimization of silicon nitride thicknesses is also required. The two-step oxidation process is necessary to prevent extension of a "bird's beak" to the first sidewall $SiO_2$ so that the sidewall window can be selectively opened and to prevent the generation of defects. In addition, due to the bird's beak of the second oxidation, it is difficult to control the size of the "graft-base" sidewall contact between the poly-crystalline and monocrystalline silicon base. Such a technique involving repeated or added steps is undesireable and not well suited for a high volume manufacturing environment.

In yet another article, entitled "SDX: A Novel Self-Aligned Technique and Its Application to High-Speed Bipolar LSI's" by Yamamoto et al., IEEE Transactions on Electron Devices, Vol. 35, No. 10, October 1988, pages 1601-1608, a self-aligned fabrication process is disclosed. The SDX process comprises four sub-processes which include: boron doping into a substrate, depositing undoped polysilicon on the substrate, thermally diffusing the boron impurity from the substrate into the polysilicon; and selectively etching the polysilicon, whereby the low boron-doped polysilicon is etched but the highly boron-doped polysilicon is not. While the SDX process provides for self-alignment of an isolation and transistor pattern, the process disadvantageously requires numerous steps which add complexity to the transistor fabrication process. In addition, the sloping opening makes it difficult to form the additional base-emitter sidewall. The added complexity is undesireable in a high volume manufacturing environment.

In U.S. Pat. No. 4,994,400 entitled "Method of Fabricating a Semiconductor Device Using a Tri-layer Structure and Conductive Sidewalls" granted to Yamaguchi et al. and issued Feb. 19, 1991, a tri-layer structure is disclosed. The tri-layer structure with conductive sidewalls is disadvantageously susceptible to formation of the above-mentioned "bird's beak". That is, formation of the conductive polysilicon sidewalls followed by deposition of the $SiO_2$ layer make the structure highly susceptible to the formation of "bird's beak" and the disadvantages associated therewith. The procedure requires triple reactive ion etching of the active base, making it susceptible to defects. Also, the sloping nature of the conducting sidewall makes it difficult to form a second insulating sidewall, giving increased possibility of base-emitter short circuits. Furthermore, the method of Yamaguchi et al. involves numerous fabrication steps which add complexity to the manufacturing process. Such complexity is disadvantageous and undesireable in high volume manufacturing of bipolar devices.

It is thus desireable to provide a self-aligned emitter to polysilicon base process which is unsusceptible to disadvantages associated with the formation of "bird's beak". It is further desireable to provide a bipolar transistor fabrication process which is simple to implement and advantageous for use in high volume manufacturing of bipolar transistor devices.

SUMMARY OF THE INVENTION

It is an object of the invention to provide a method for fabricating a bipolar transistor which overcomes the problems in the art as discussed above.

Another object of the present invention is to provide a self-aligned method that is well suited for use in high volume manufacturing of bipolar transistors.

Yet another object of the present invention is to provide a process for fabricating a bipolar transistor having low parasitic characteristics.

According to the invention, a method of fabricating an improved bipolar transistor comprising the steps of:

a) providing a silicon substrate of a first conductivity type, said substrate having a planar surface, a subcollector region of a second conductivity type formed in said substrate, an epitaxial layer of said second conductivity type formed on said planar surface of said substrate, and first and second spaced apart isolation regions extending through said epitaxial layer into said substrate, and further having an intermediate region extending through at least said epitaxial layer and further being located between and spaced apart from the first and second regions;

b) forming a collector reach through region of a second conductivity type between the intermediate and second spaced apart regions;

c) forming a field oxide layer upon said planar surface;

d) forming a device active area window in a portion of said field oxide layer to expose said planar surface, said device active area window being positioned between the first and intermediate spaced apart regions;

e) depositing a polysilicon layer upon said field oxide layer and the device active area window;

f) depositing a oxide/nitride passivation layer upon said polysilicon layer;

g) removing a portion of said passivation layer, said portion being that which is positioned over the field oxide layer, thereby leaving a remainder of said passivation layer over the device active area window and further exposing said polysilicon layer outside the device active area window;

h) growing a passivating oxide layer over said exposed polysilicon layer, wherein said passivating oxide does not grow over the remainder of said oxide/nitride passivation layer and wherein a vertical bird's beak is formed on each side of the remainder of said oxide/nitride passivation layer;

i) forming an extrinsic base contact in said polysilicon and said passivating oxide layer;

j) stripping the remainder of said oxide/nitride passivating layer thereby exposing said polysilicon layer in the region of the device active area window;

k) etching the exposed polysilicon layer down to said epitaxial layer underneath, thereby forming an emitter window having polysilicon sidewalls;

l) annealing the substrate to form an extrinsic base of a prescribed depth in said epitaxial layer;

m) implanting ions of the first conductivity type through the emitter window to form an intrinsic base in said epitaxial layer, the polysilicon sidewalls acting as a mask for implanting the ions;

n) exposing the substrate to a prescribed pressure and temperature to form a base oxide in the emitter window, said base oxide comprising a polysilicon oxide adjacent to an active device region in the emitter window;

o) forming sidewall spacers in the emitter window;

p) forming an emitter polysilicon layer containing a dopant of the second conductivity type in the emitter window;

q) implanting ions of the second conductivity type into said emitter polysilicon layer;

r) annealing the substrate to diffuse the dopant into the epitaxial layer to form an emitter;

s) forming an emitter polysilicon region; and t) opening up base and collector contact regions. In addition, the invention includes an improved bipolar transistor made according t the above method.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, wherein like numerals are used for like and corresponding parts of the various drawings and in which.

DETAILED DESCRIPTION OF THE PREFERRED EMBODIMENTS

Figure 1:
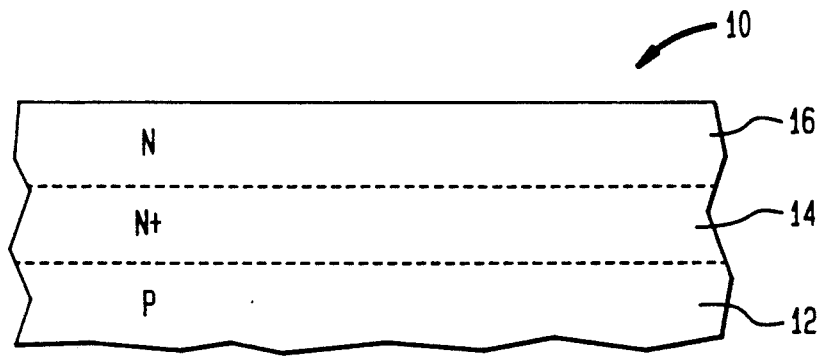
FIGS. 1 through 8 illustrate intermediate steps in forming a bipolar transistor according to the present invention.

Referring now to FIG. 1, there is shown in cross-section as portion of a silicon wafer 10 used in fabricating the invention. A monocrystalline silicon substrate 12 of a first conductivity type has a diffusion layer 14 of a second conductivity type formed therein. Formation of the diffusion layer 14 is accomplished by any well known technique. A top layer 16 comprises an epitaxial layer (sometimes referred to as epi) of the second conductivity type and in which the transistor is formed. Epi layer 16 can be formed by any known epitaxial process. In the case of an NPN transistor, substrate 12 comprises a P⁻ substrate, diffusion layer 14 comprises an N⁺ diffusion layer, and epi layer 16 comprises an N⁻ epi layer.

Figure 2:
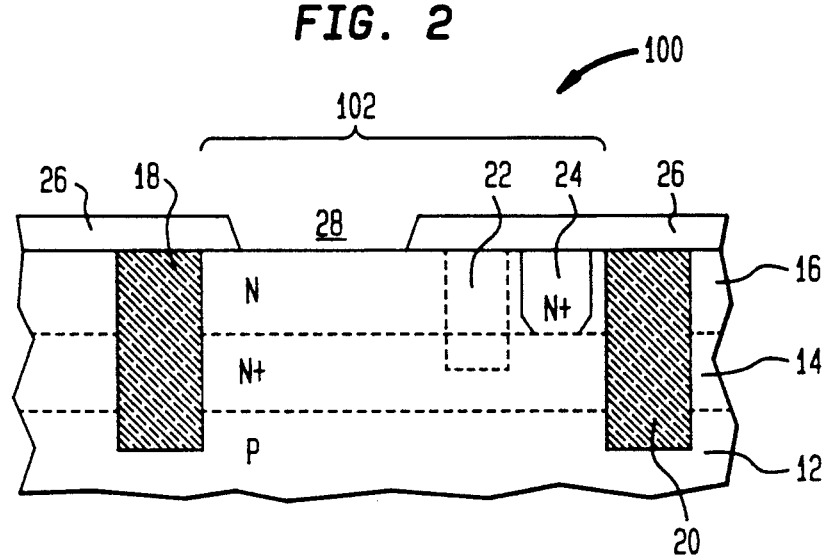

Referring now to FIG. 2, transistor isolation is provided by first and second spaced apart isolation regions, 18 and 20, respectively. Isolation regions 18 and 20 comprise first and second deep trenches filled with any suitable trench fill material, such as, silicon dioxide, for example. Isolation regions 18 and 20 extend through the epitaxial layer 16, diffusion layer 14, and into the substrate 12. Formation of first and second spaced apart isolation regions, 18 and 20, respectively, can be accomplished by any well known technique. Regions 18, 20 form part of an isolation area enclosing the active transistor structure. In addition, an intermediate region 22 is positioned between first and second spaced apart isolation regions, 18 and 20, respectively and spaced apart from the same. Intermediate region 22 comprises a region extending through at least the epi layer 16. Preferably, intermediate region 22 comprises a portion of the epi layer 16. Alternatively, intermediate region 22 can comprise an oxide isolation region positioned between the first and second isolation regions, 18 and 20, respectively, and extending through at least the epi layer 16.

The general area in which a transistor can be formed is denoted with numeral 100 and further indicated by the bracket labeled 102 in FIG. 2. A collector reach through region 24 of the second conductivity type is formed in epi layer 16, the collector reach through region 24 being positioned between intermediate region 22 and second isolation region 20. Collector reach through region 24 comprises, for example, an N⁺ reach through region in the case of an NPN transistor and can be formed by conventional techniques.

A first oxide layer 26 (or field oxide) is deposited upon the planar surface of epi layer 16 and patterned to provide a device active area window 28 therein. Oxide layer 26 comprises a layer of thickness in the range of 500 to 1000 Å. Device active area window 28 is positioned in a portion of oxide layer 26 and located between the first isolation region 18 and the intermediate region 22 to expose a corresponding portion of the planar surface of epi layer 16.

Figure 3:
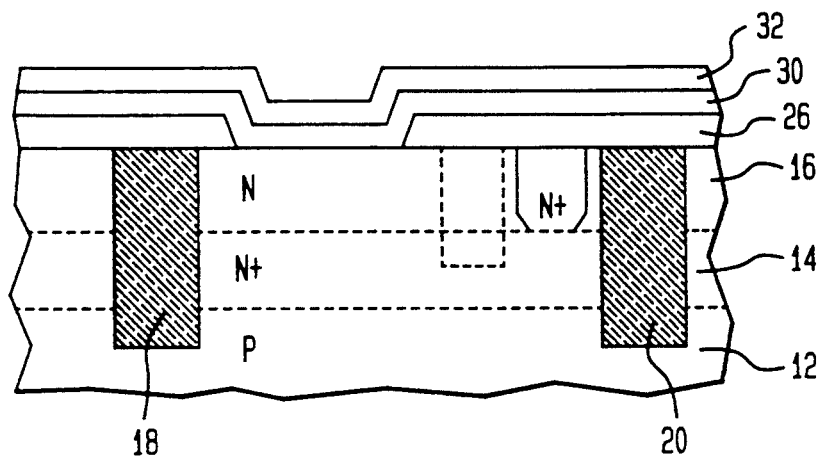

Referring now to FIG. 3, a conformal layer of base polysilicon 30 having a first prescribed thickness is deposited upon the first oxide layer 26 and the device active area window 28. The thickness of the polysilicon layer 30 is between 800–2500 Å, preferably 1500 Å. Formation of the polysilicon layer 30 accomplished by known techniques in an ultra high vacuum/low temperature epitaxial (UHV/CVD) system or a more conventional low pressure chemical vapor deposition (LPCVD) system with good thickness control. The prescribed thickness of the polysilicon layer 30 is related to the desired sheet resistance for a particular semiconductor device application and therefore may vary from that of the preferred embodiment. Polysilicon layer 30 is thereafter implanted with ions of a desired conductivity type, for example, p-type, in the case of an NPN transistor by any well known ion implantation technique.

Subsequent to the formation and ion implantation of polysilicon layer 30, an oxide/nitride passivation layer 32 is deposited upon polysilicon layer 30. Oxide/nitride passivation layer 32 preferably comprises a relatively thin oxide layer formed from tetraeythlorthosilicate (TEOS), followed by deposition of a nitride layer. Together, the relatively thin oxide layer and the nitride layer form the passivation layer 32, having a thickness of approximately 1000 Å.

Figure 4:
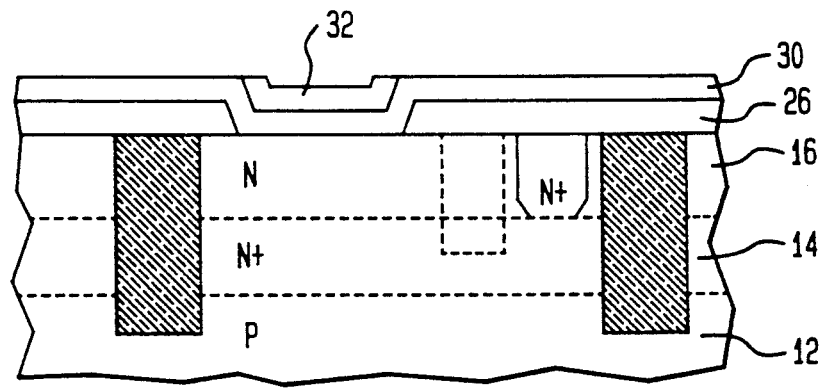

Referring now to FIG. 4, oxide/nitride passivation layer 32 is thereafter etched back over the field oxide layer 26 using well-known standard, resist planarization/etch-back techniques. That is, a resist is applied, patterned, planarized and etched-back, thereby removing the desired portion of oxide/nitride passivation layer 26. This results in removal of the oxide/passivation layer 32 above the field oxide layer 26, however a portion of oxide/nitride layer 32 is left remaining over the region of device active area window 28.

Figure 5:
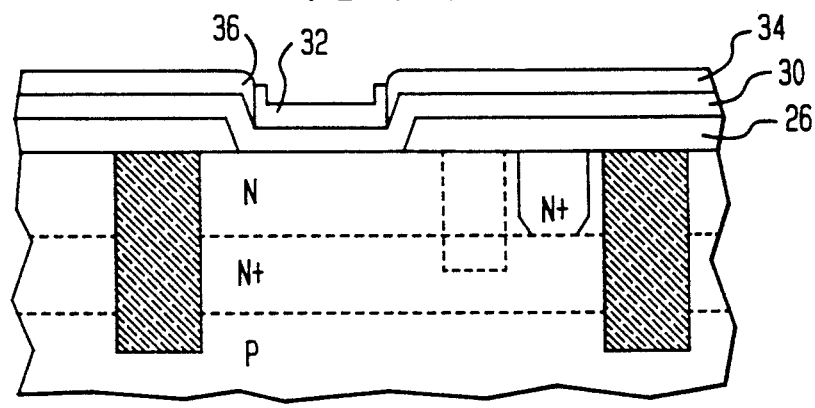

The resist used in the removal of the oxide/passivation layer 32 above the field oxide layer 26 is thereafter removed and a passivating oxide 34 is grown over the base polysilicon 30. (See FIG. 5) The passivating oxide 34 does not grow over the base polysilicon 30 in the region covered by oxide/nitride passivation layer 32. However, a vertical bird's beak 36 is formed between the vertical sides of the remainder of the oxide/nitride passivation layer 32 and the base polysilicon 30. The vertical bird's beak advantageously provides a more vertical profile to the sidewall, compensating for the slope of the original deposited layer. This allows better formation of the subsequent sidewalls.

Figure 6:
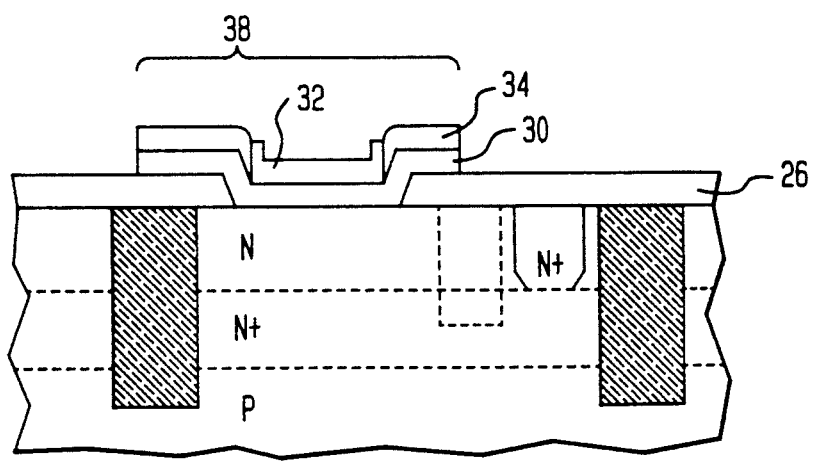
Figure 7:
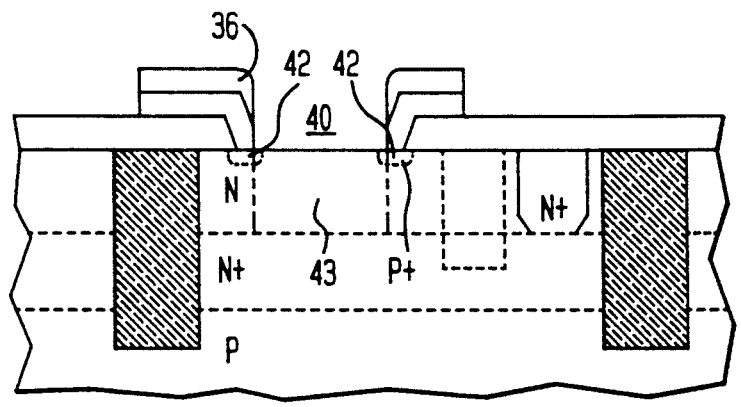

Referring now to FIG. 6, an extrinsic base region, indicated by the bracket labeled 38, is defined in the passivating oxide layer 34 and the underlying polysilicon layer 30 by well known definition and etch techniques. The remainder of oxide/nitride layer 32 is thereafter stripped by selective removal of nitride in, for example, hot phosphoric acid, followed by a short dip in dilute hydrofluoric acid to strip the underlying oxide, thereby exposing the underlying polysilicon 30. Using the passivating oxide layer 34 as an etch mask, base polysilicon 30 is etched down to the single-crystal silicon 16 underneath. Furthermore, an emitter window 40 is advantageously created by the etching of the base polysilicon 30. An extrinsic base 42 is then formed by out-diffusion from the base polysilicon 30, by annealing the substrate at a appropriate temperature for a prescribed time. (See FIG. 7) That is, the substrate is annealed at a temperature of between 850 and 1000° C. in an inert ambient, such as nitrogen or argon, for a prescribed time to form the extrinsic base 42 of a prescribed depth in the epitaxial layer 16.

At this point, a collector pedestal implant (of, for example, high-energy phosphorous) can be performed, with the extrinsic base polysilicon 30 sidewall acting as a mask, for the formation of extrinsic collector area 43. The collector-pedestal implant is used to improve the high-frequency performance of the transistor without also raising the parasitic base capacitance. The extrinsic collector area 43 is thus advantageously self-aligned to the extrinsic base area 42.

Figure 8:
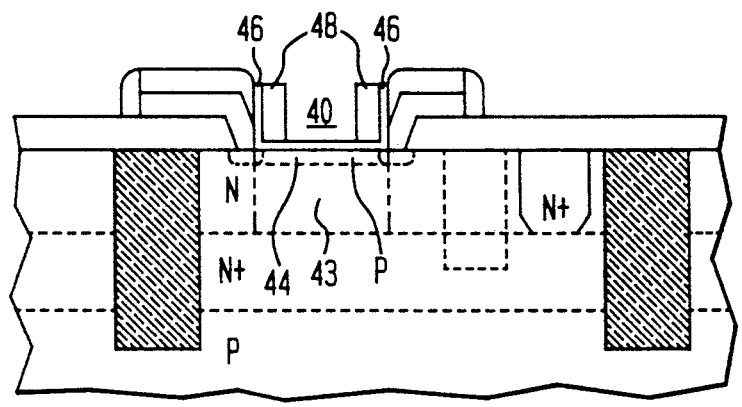

Referring now to FIG. 8, an intrinsic base 44 is then formed. That is, ions of the first conductivity type are implanted through the emitter window 40 to form intrinsic base 44 in the epitaxial layer 16. The ion implant preferably is a 3-20 KeV boron implant, preferably 5 keV. The implant is then annealed by either furnace anneal at 800°-900° C., or rapid-thermal annealing at 950°-1050° C.

The substrate is then exposed to a prescribed oxygen pressure of 1-10 ATM and temperature of 600° C. to form a base oxide 46 in the emitter window 40 as shown in FIG. 8. This is known as base reoxidation or REOX in the art. Base oxide 46 provides isolation between the extrinsic base region and the yet to be formed emitter region of the device. The base oxide 46 comprises a polysilicon oxide adjacent to an active device region in the emitter window 40.

Referring still to FIG. 8, emitter sidewall spacers 48 are thereafter formed. Formation of the emitter sidewall spacers 48 begins by depositing a nitride layer over the structure, further depositing a TEOS (or polysilicon) layer, and subsequently etching by reactive ion etching (RIE) the TEOS (or polysilicon) and nitride layers. The underlying base oxide 46 protects the further underlying epi layer 16 from RIE damage.

Figure 9:
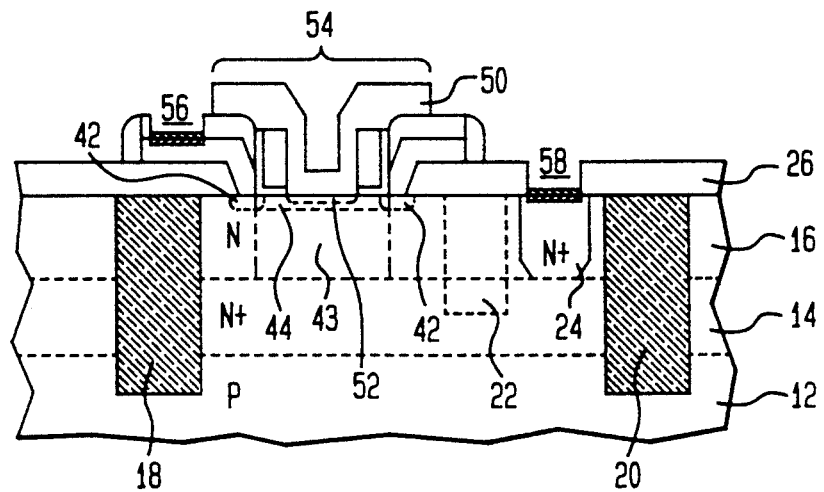
FIG. 9 illustrates in cross-section a bipolar transistor constructed according to the invention.

Referring now to FIG. 9, after the RIE etch back of the TEOS layer discussed above, the resulting sidewalls, comprising etched nitride and TEOS layers, are further exposed to a wet etch to remove a portion of the base oxide 46 defined by the sidewalls 48. A portion of the intrinsic base region 44 is thereby exposed. The exposed portion of base region 44 is substantially undamaged by the wet etch resulting in a high quality interface and further maintaining the integrity thereof. Sidewall spacers 48 and the underlying base oxide 46 also provide isolation between the emitter (yet to be formed) and the extrinsic base.

An emitter polysilicon layer 50 containing a dopant of the second conductivity type is thereafter deposited in emitter window 40, the emitter polysilicon layer 50 having a prescribed thickness. Ions of the second conductivity type are then implanted into the emitter polysilicon layer 50. The substrate is subsequently annealed either by furnace anneal (900°-1000° C.) or by rapid thermal anneal (900°-1050° C. for a few seconds) to diffuse the dopant of the emitter polysilicon layer 50 into the epitaxial layer 16 to form an emitter 52. An emitter polysilicon region, as indicated by bracket 54 in FIG. 9, is then formed.

Base and collector contact regions, 56 and 58, respectively, are thereafter opened up. The resultant structure is ready for subsequent metalization processes for connection with other desired devices of a particular circuit design.

In the resultant structure, the collector-base and base-emitter junctions are self-aligned to each other, in addition to the standard self-alignment of the base and emitter in the device structure, resulting in a double-self-aligned device structure. As a result of the above-mentioned double self-alignment, parasitic base-collector capacitances are substantially reduced, as well as the active device area of the transistor. This reduction of parasitic base-collector capacitances and the reduction in the active device area lead to substantially improved bipolar transistor device performance.

There is thus provided a method of making an improved bipolar transistor device having a self-aligned emitter to polysilicon base, the process overcoming disadvantages associated with formation of "bird's beak". In addition, a bipolar transistor produced according to the method of the present invention is characterized by low parasitic characteristics. Furthermore, a bipolar transistor fabrication process for advantageous use in a high volume manufacturing environment has been provided.

While the invention has been particularly shown and described with reference to the preferred embodiment thereof, it will be understood by those skilled in the art that various changes in form and detail may be made therein without departing from the spirit and scope of the invention. For instance, a PNP transistor may be formed instead of an NPN transistor.

What is claimed is:

1. A method of fabricating an improved bipolar transistor comprising the steps of:
   a) providing a silicon substrate of a first conductivity type, said substrate having a planar surface, a subcollector region of a second conductivity type formed in said substrate, an epitaxial layer of said second conductivity type formed on said planar surface of said substrate, and first and second spaced apart isolation regions extending through said epitaxial layer into said substrate, and further having an intermediate region extending through at least said epitaxial layer and further being located between and spaced apart from the first and second regions;
   b) forming a collector reach through region of a second conductivity type between the intermediate and second spaced apart regions;
   c) forming a field oxide layer upon said planar surface;
   d) forming a device active area window in a portion of said field oxide layer to expose said planar surface, said device active area window being positioned between the first and intermediate spaced apart regions;
   e) depositing a polysilicon layer upon said field oxide layer and the device active area window;
   f) depositing a oxide/nitride passivation layer upon said polysilicon layer;
   g) removing a portion of said passivation layer, said portion being that which is positioned over the field oxide layer, thereby leaving a remainder of said passivation layer over the device active area window and further exposing said polysilicon layer outside the device active area window;
   h) growing a passivating oxide layer exposed polysilicon layer, wherein said passivating oxide does not grow over the remainder of said oxide/nitride passivation layer and wherein a vertical bird's beak is formed on each side of the remainder of said oxide/nitride passivation layer;
   i) forming an extrinsic base contact in said polysilicon and said passivating oxide layer;
   j) stripping the remainder of said oxide/nitride passivating layer thereby exposing said polysilicon layer in the region of the device active area window;
   k) etching the exposed polysilicon layer down to said epitaxial layer underneath, thereby forming an emitter window having polysilicon sidewalls;
   l) annealing the substrate to form an extrinsic base of a prescribed depth in said epitaxial layer;
   m) implanting ions of the first conductivity type through the emitter window to form an intrinsic base in said epitaxial layer, the polysilicon sidewalls acting as a mask for implanting the ions;
   n) exposing the substrate to a prescribed pressure and temperature to form a base oxide in the emitter window, said base oxide comprising a polysilicon oxide adjacent to an active device region in the emitter window;
   o) forming sidewall spacers in the emitter window;
   p) forming an emitter polysilicon layer containing a dopant of the second conductivity type in the emitter window;
   q) implanting ions of the second conductivity type into said emitter polysilicon layer;
   r) annealing the substrate to diffuse the dopant into the epitaxial layer to form an emitter;
   s) forming an emitter polysilicon region; and
   t) opening up base and collector contact regions.
2. The method of claim 1, wherein said intermediate region of step a) comprises an isolation region.

* * * * *

UNITED STATES PATENT AND TRADEMARK OFFICE
CERTIFICATE OF CORRECTION

PATENT NO. : 5,294,558

DATED : March 15, 1994

INVENTOR(S) : Seshadri Subbanna

It is certified that error appears in the above-indentified patent and that said Letters Patent is hereby corrected as shown below:

In column 9, line 35, after "layer" add the words -- over said--.

Signed and Sealed this

Fourth Day of October, 1994

Attest:

BRUCE LEHMAN

Attesting Officer

Commissioner of Patents and Trademarks